United States Patent
Lu

(10) Patent No.: US 11,579,669 B2
(45) Date of Patent: Feb. 14, 2023

(54) MEMORY MODULE FOR MAINTAINING EFFICIENT HEAT DISSIPATION AND ELECTRONIC DEVICE

(71) Applicant: Fulian Precision Electronics (Tianjin) Co., LTD., Tianjin (CN)

(72) Inventor: Wen-Hu Lu, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 0 days.

(21) Appl. No.: 17/460,563

(22) Filed: Aug. 30, 2021

(65) Prior Publication Data

US 2022/0172748 A1 Jun. 2, 2022

(30) Foreign Application Priority Data

Dec. 1, 2020 (CN) .......................... 202011399782.2

(51) Int. Cl.
*G06F 1/18* (2006.01)
*G06F 1/20* (2006.01)

(52) U.S. Cl.
CPC ................ *G06F 1/186* (2013.01); *G06F 1/20* (2013.01)

(58) Field of Classification Search
CPC ....... H05K 7/1409; H05K 2201/10204; H05K 1/141; G06F 1/20; G06F 1/186; H01R 12/7058; H01R 13/6273; G11C 5/04
See application file for complete search history.

(56) References Cited

U.S. PATENT DOCUMENTS

| 7,403,383 B2* | 7/2008 | McGuff | G06F 1/185 |
| | | | 361/679.48 |
| 7,828,564 B2* | 11/2010 | Guan | G06F 1/185 |
| | | | 361/679.48 |

FOREIGN PATENT DOCUMENTS

CN 208888753 U 5/2019

* cited by examiner

Primary Examiner — James Wu
(74) Attorney, Agent, or Firm — ScienBiziP, P.C.

(57) ABSTRACT

A memory module assisting in efficient heat dissipation includes a motherboard, a plurality of fixing devices, a plurality of memory cards, and a plurality of dummy memory cards. The fixing devices are fixed on the motherboard side by side. The memory cards are fixed on some of the fixing devices as necessary, and the dummy memory cards are fixed on the remaining fixing devices which are vacant. The dummy memory cards inserted into the vacant fixing devices prevent the flow of air through the space above the vacant fixing devices. An electronic device including the memory module is also disclosed.

7 Claims, 5 Drawing Sheets

US 11,579,669 B2

MEMORY MODULE FOR MAINTAINING EFFICIENT HEAT DISSIPATION AND ELECTRONIC DEVICE

FIELD

The subject matter herein generally relates to data storage devices, especially to a memory module and an electronic device.

BACKGROUND

With the development of communication and computer technology, Dual In-line Memory Module (DIMM) cards have become more popular for use in the PC and electronic industry, and thus DIMM socket connectors mounted on a motherboard for receiving DIMM cards have been developed. When the number of DIMM cards is less than the number of DIMM socket connectors, cold air will be lost through empty space above the DIMM socket connector, and hot air will return through the same space, this does not facilitate heat dissipation.

BRIEF DESCRIPTION OF THE DRAWINGS

Implementations of the present technology will now be described, by way of embodiment, with reference to the attached figures.

DETAILED DESCRIPTION

Figure 1:
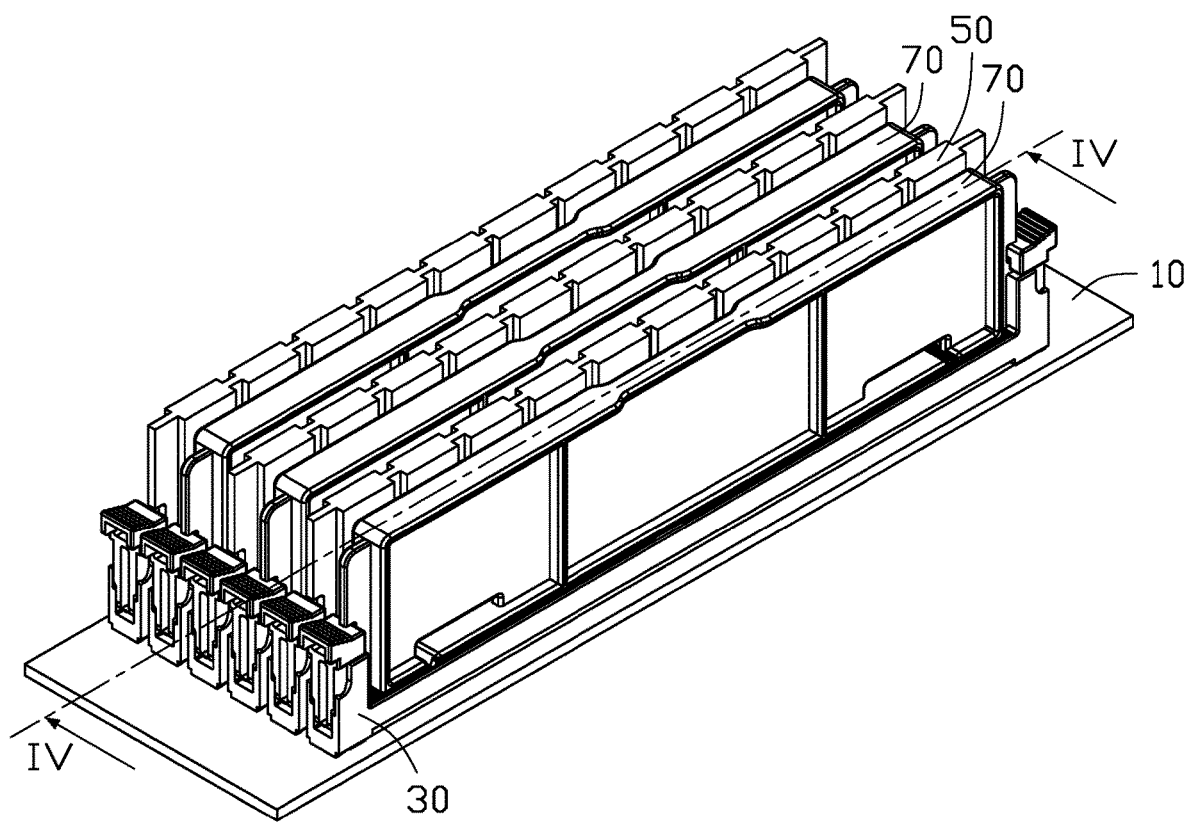
FIG. 1 is an assembled, isometric view of an embodiment of a memory module.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like.

Referring to FIG. 1, an embodiment of an exemplary memory module 100 is shown. The memory module 100 includes a motherboard 10, a plurality of fixing devices 30, a plurality of memory cards 50, and a plurality of dummy memory cards 70. The plurality of fixing devices 30 are fixed on the motherboard 10 side by side. The memory cards 50 are fixed on some of the fixing devices 30 as necessary, and the dummy memory cards 70 are fixed on the remaining fixing devices 30 which are vacant. The sum of the number of the memory cards 50 and the dummy memory cards 70 is equal to the number of the fixing devices 30. The memory cards 50 and the dummy memory cards 70 are disposed in an alternating manner.

Figure 2:
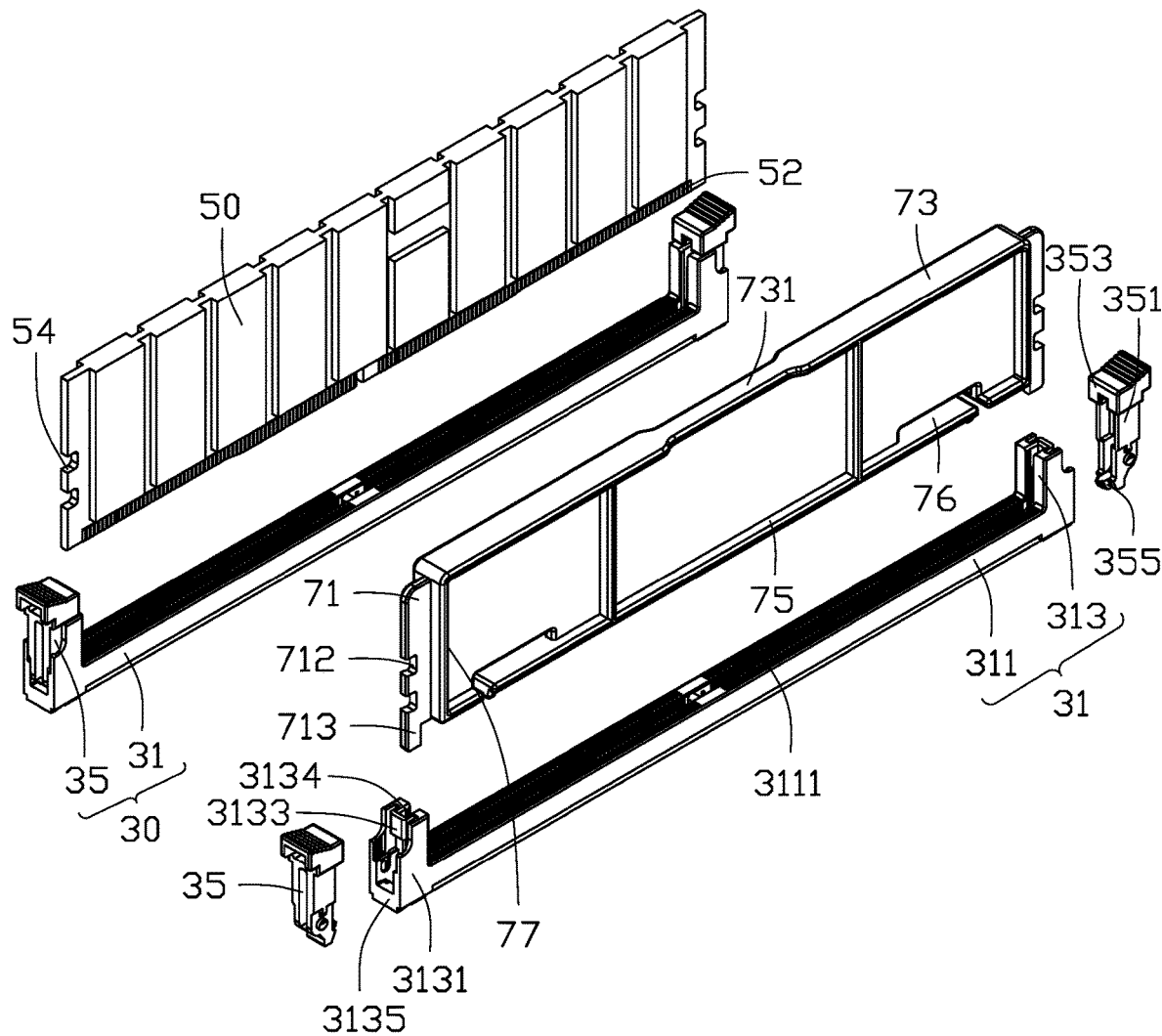
FIG. 2 is an exploded, isometric view showing a dummy memory card, a memory card, and two fixing devices.
Figure 3:
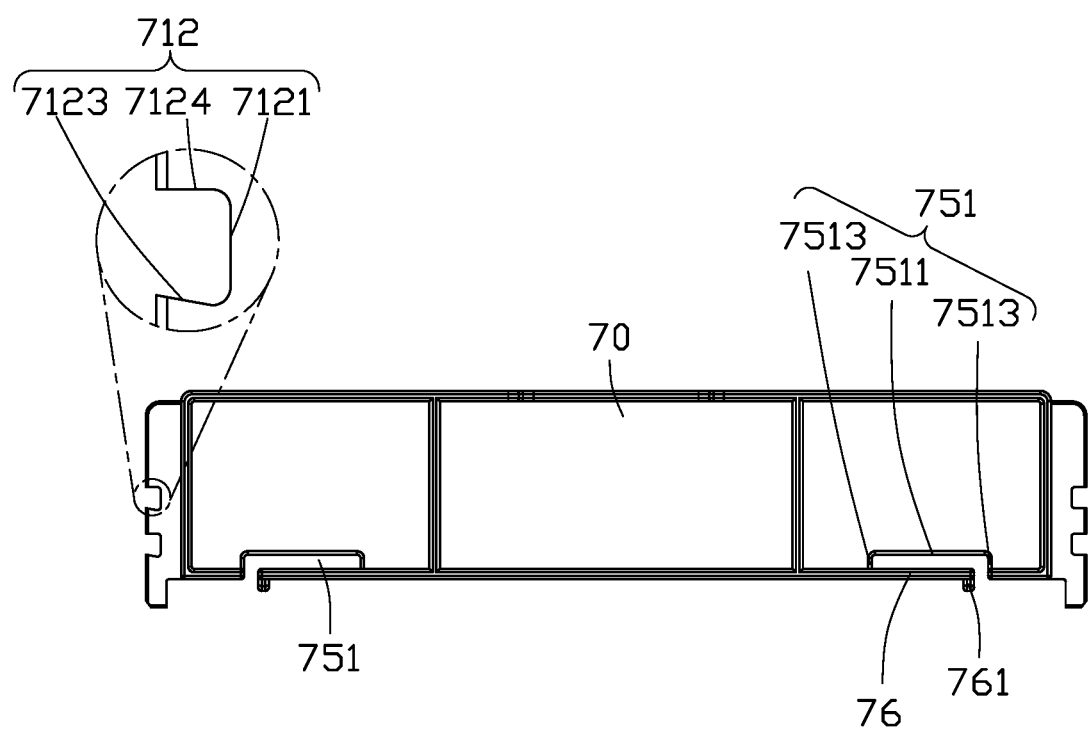
FIG. 3 is a side view of the dummy memory card of FIG. 2.
Figure 4:
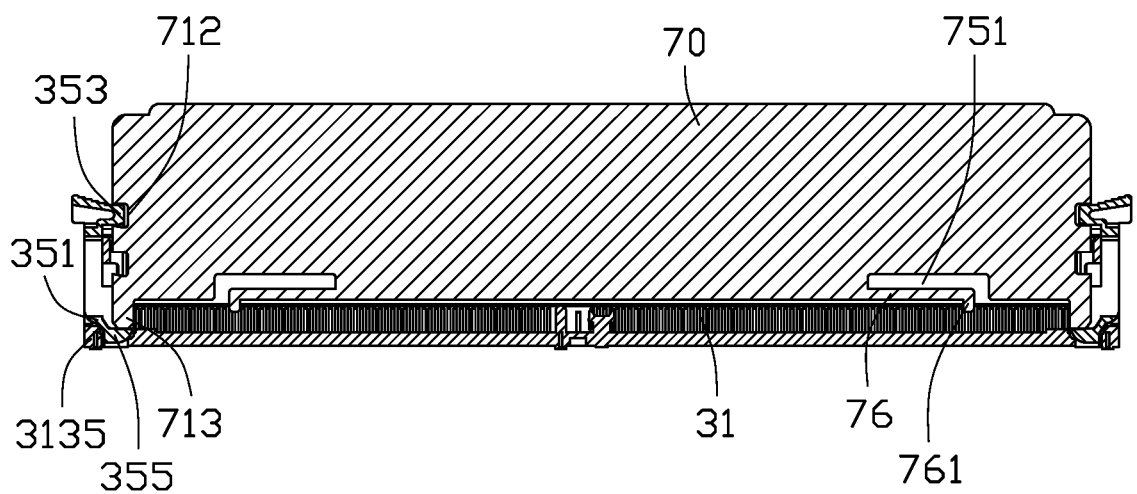
FIG. 4 is a cross-section view along line IV-IV of FIG. 1.

Referring to FIGS. 2 to 4, each of the fixing devices 30 includes a connector 31 and two locking members 35 rotatably connected to both ends of the connector 31 respectively. The connector 31 includes an elongated main body 311 and two mounting portions 313 disposed on two ends of the main body 311. The main body 311 defines a slot 3111 penetrating the main body 311 and the two mounting portions 313. The slot 3111 is configured for accommodating and clamping a bottom of one memory card 50 and electrically connecting the memory card 50 and the motherboard 10.

Each of the two mounting portions 313 includes two mounting plates 3131 extending from two side edges of the main body 311, a first connecting plate 3133 connecting tops of two side edges of the two mounting plates 3131 adjacent to the main body 311, and a second connecting plate 3135 connecting bottoms of two side edges of the two mounting plates 3131 away from the main body 311. The first connecting plates 3133, the mounting plates 3131, and the second connecting plates 3135 jointly form an accommodating space communicating with the slot 3111. The first connecting plate 3133 defines a guiding groove 3134. The guiding groove 3134 is in communication with the accommodating space and corresponds in position to the slot 3111.

Each of the two locking members 35 is pivotally connected to the two mounting portions 313. Each of the two locking members 35 includes a base portion 351, a locking portion 353, and a supporting portion 355. The locking portion 353 and the supporting portion 355 protrude from opposite ends of the base portion 351. The base portion 351 is accommodated in the accommodating space and pivotally connected to the two mounting plates 3131. The supporting portion 355 is accommodated in the accommodating space. A side wall of the supporting portion 355 away from the main body 311 abuts against a side wall of the second connecting plate 3135 adjacent to the main body 311, to limit the rotation of the locking member 35. The locking portion 353 extends out of the accommodating space and corresponds in position to the guiding groove 3134.

The dummy memory card 70 includes two opposite end portions 71, a top portion 73, and a bottom portion 75. The dummy memory card 70 is made of plastic. Each of the end portions 71 defines a first notch 712, the locking portion 353 is engaged with the first notch 712. The first notch 712 includes a bottom wall 7121, a first side wall 7123, and a second side wall 7124. The second side wall 7124 is perpendicular to the bottom wall 7121. The locking portion 353 is in contact with the first side wall 7123, and the first side wall 7123 is obliquely arranged with respect to the bottom wall 7121, so as to prevent separation of the locking portion 353 from the first notch 712 when subjected to an upward pull.

An inserting portion 713 protrudes from an end of each of the end portions 71. The inserting portion 713 is guided through the guiding groove 3134, is inserted into a space between the two mounting portions 313, and is supported on the supporting portion 355.

Two opposite sides of the top portion 73 are recessed inwards to form a holding portion 731 for a user to grip.

The bottom portion 75 defines a second notch 751. The second notch 751 includes a bottom wall 7511 and two side walls 7513 perpendicular to the bottom wall 7511. An elastic resisting portion 76 is disposed on one of the two side walls 7513 and extends towards another one of the two side walls 7513. The elastic resisting portion 76 is not in contact with the another one of the two side walls 7513. The elastic resisting portion 76 is spaced apart from the bottom wall 7511 by a predetermined distance, so that an end of the elastic resisting portion 76 adjacent to the another one of the two side walls 7513 can move towards the bottom wall 7511 under pressure. A protrusion 761 is disposed on a side of the elastic resisting portion 76 away from the bottom wall 7511. The protrusion 761 resists against a top of the connector 31.

A plurality of blocking portions 77 protrudes from sides of the dummy memory card 70. The arrangement of the blocking portions 77 reduces a distance between two adjacent dummy memory cards 70 or between adjacent dummy memory card 70 and memory card 50, so that the loss of cold air and the return of hot air flowing through a space between two dummy memory cards 70 or between adjacent dummy memory card 70 and memory card 50 is decreased.

A plurality of pins 52 is arranged at the bottom of the memory card 50. The bottom of the memory card 50 is inserted into the slot 3111, and the pins 52 are electrically connected with the slot 3111. The memory card 50 includes opposite ends, each of the ends defines an arc notch 54. The locking portion 353 of one of the fixing devices 30 is engaged with the arc notch 54 to fix the memory card 50 in place.

To fully insert and secure the dummy memory card 70 into the fixing device 30, the dummy memory card 70 is guided by the guiding groove 3134 and is inserted until the inserting portion 713 is in contact with the supporting portion 355. Insertion of the dummy memory card 70 is continued, rotating the locking members 35 inward until the locking portions 353 are engaged with the first notches 712. At this point, the protrusion 761 is in contact with the top of the main body 311, so that the elastic resisting portion 76 elastically resists against the top of the connector 31.

To remove the dummy memory card 70 from the fixing device 30, the locking members 35 are rotated outward and away from the dummy memory card 70 until the locking portions 353 are removed from the first notches 712. At this point, the dummy memory card 70 is ejected outward under an elastic restoring force of the elastic resisting portion 76. The user grips and pulls the dummy memory card 70 out to remove the dummy memory card 70 from the fixing device 30.

In the memory module 100, the dummy memory cards 70 are inserted into the fixing devices 30 which are not carrying the memory cards 50, to prevent air from flowing through the space above such fixing devices 30. The loss of cold air and the return of hot air are thus decreased, aiding heat dissipation.

Figure 5:
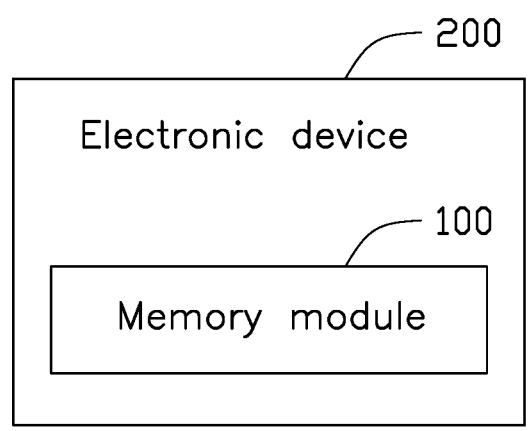
FIG. 5 is a block diagram of an embodiment of an electronic device.

Referring to FIG. 5, the memory module 100 can be applied to various electronic devices 200 with data storage module, such as computers, servers, etc.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. A memory module, comprising:
a motherboard;
a plurality of fixing devices fixed on the motherboard side by side;
a plurality of memory cards fixed on some of the plurality of fixing devices; and
a plurality of dummy memory cards fixed on the remaining of the plurality of fixing devices;
wherein a bottom of each of the plurality of dummy memory cards defines an elastic resisting portion and a notch, the elastic resisting portion extends from a side wall of the notch toward another side wall of the notch, and the elastic resisting portion is spaced apart from a bottom wall of the notch and the another side wall of the notch and resists against a top of each of the plurality of fixing devices.

2. The memory module of claim 1, wherein each of the plurality of fixing devices comprises a connector and a locking member pivotally connected to an end of the connector, the locking member comprises a locking portion, an end of each of the plurality of dummy memory cards defines a first notch and an inserting portion, the inserting portion is inserted into the connector, and the locking portion is engaged with the first notch, the elastic resisting portion resists against a top of the connector.

3. The memory module of claim 2, wherein the first notch comprises a bottom wall and a first side wall obliquely arranged with respect to the bottom wall of the first notch, the locking portion is in contact with the first side wall.

4. The memory module of claim 2, wherein a protrusion is disposed on a side of the elastic resisting portion away from the bottom wall of the notch, the protrusion resists against the top of the connector.

5. The memory module of claim 2, wherein the connector comprises a main body and a mounting portion disposed on an end of the main body, the main body defines a slot for accommodating and clamping a bottom of one memory card and electrically connecting one memory card and the motherboard, the inserting portion is inserted into the mounting portion.

6. The memory module of claim 5, wherein the mounting portion comprises two mounting plates extending from two side edges of the main body and a first connecting plate connecting tops of two side edges of the two mounting plates adjacent to the main body, the first connecting plate defines a guiding groove for guiding the inserting portion, the inserting portion is inserted into a space between the two mounting plates.

7. The memory module of claim 6, wherein the mounting portion further comprises a second connecting plate connecting bottoms of two side edges of the two mounting plates away from the main body, the locking member further comprises a supporting portion, the inserting portion is supported on the supporting portion, a side wall of the supporting portion away from a side wall of the main body resists against a side wall of the second connecting plate adjacent to the side wall of the main body.

* * * * *